(12) United States Patent
Kannan et al.

(10) Patent No.: US 7,516,437 B1
(45) Date of Patent: Apr. 7, 2009

(54) SKEW-DRIVEN ROUTING FOR NETWORKS

(75) Inventors: Parivallal Kannan, Longmont, CO (US); Carl M. Stern, Boulder, CO (US)

(73) Assignee: XILINX, Inc., San Jose, CA (US)

( * ) Notice: Subject to any disclaimer, the term of this patent is extended or adjusted under 35 U.S.C. 154(b) by 84 days.

(21) Appl. No.: 11/490,670

(22) Filed: Jul. 20, 2006

(51) Int. Cl.
*G06F 17/50* (2006.01)
(52) U.S. Cl. .................. 716/12; 716/6; 716/13
(58) Field of Classification Search ........... 716/13, 716/6, 12
See application file for complete search history.

(56) References Cited

U.S. PATENT DOCUMENTS

| | | | | |
|---|---|---|---|---|
| 5,659,484 | A * | 8/1997 | Bennett et al. ............... | 716/16 |
| 6,240,541 | B1 * | 5/2001 | Yasuda et al. ................ | 716/6 |
| 6,661,810 | B1 * | 12/2003 | Skelly et al. ................ | 370/516 |
| 6,952,813 | B1 * | 10/2005 | Rahut ......................... | 716/6 |
| 7,308,664 | B1 * | 12/2007 | Fung et al. .................. | 716/6 |
| 2004/0078766 | A1 * | 4/2004 | Andreev et al. ............... | 716/6 |
| 2004/0130367 | A1 * | 7/2004 | Swarbrick et al. ........... | 327/165 |
| 2005/0015738 | A1 * | 1/2005 | Alpert et al. .................. | 716/10 |
| 2007/0033560 | A1 * | 2/2007 | Johnston ....................... | 716/6 |
| 2007/0220522 | A1 * | 9/2007 | Coene et al. ................ | 718/104 |

OTHER PUBLICATIONS

Hart, Peter E. et al.; "A Formal Basis for the Heuristic Determination of Minimum Cost Paths" IEEE Transactions On Systems Science and Cybernetics, Jul. 1968, vol. SSC-4, No. 2, available from IEEE, 3 Park Avenue, New York, NY 10016-5997.

McMurchie, L. et al., "Pathfinder: A Negotiation-Based Performance-Driven Router for FPGAs", Third International ACM Symposium on Field-Programmable Gate Arrays, 1995, pp. 1-7, available from IEEE, 3 Park Avenue, New York, NY 10016-5997.

* cited by examiner

*Primary Examiner*—Paul Dinh
*Assistant Examiner*—Suchin Parihar
(74) *Attorney, Agent, or Firm*—Kevin T. Cuenot; Justin Liu

(57) ABSTRACT

A method of generating a low-skew network for a circuit design can include routing connections between a source and a plurality of loads of the network, determining a delay for at least one routed connection, and accepting the routed connections if the delay of each routed connection is within a skew tolerance range.

10 Claims, 1 Drawing Sheet

SKEW-DRIVEN ROUTING FOR NETWORKS

BACKGROUND

1. Field of the Invention

The present invention relates to the field of circuit design and, more particularly, to routing networks with low skew.

2. Description of the Related Art

Skew is a critical aspect of designing clock networks as well as data networks within a circuit design. In general, skew on a network is the difference in the propagation delays between the fastest terminal load pin and the slowest terminal load pin on that network as measured from the driver, or source, pin. Skew is the result of different electrical lengths, which in turn are a result of different physical lengths and/or different velocities of signal propagation. In consequence, skew has a significant effect on the maximum operating frequency of a circuit design implemented on a programmable logic device such as a field programmable gate array (FPGA).

Typical FPGAs provide a number of high-speed, low-skew wiring resources. These wiring resources are reserved for use by clock networks and, as such, are unavailable to the circuit design for use as data paths. The inclusion of low-skew routing resources is not cost free. Specialized routing resources require silicon area, a quantity that is in limited supply. This area, once used, is not available for other components of the circuit design. Further, these specialized resources must be tested using techniques tailored to the resources. As a result, the inclusion of low-skew routing resources can be expensive, thereby increasing the overall cost of the FPGA.

Because low-skew resources are useful in a variety of different applications it is desirable to include as many low-skew resources as is possible within an FPGA device. The desirability of having a large amount of low-skew resources, however, must be balanced against the cost of providing such resources. Accordingly, it would be beneficial to provide a technique that facilitates the use of general-purpose routing resources for skew-sensitive networks.

SUMMARY

The present invention provides methods and articles of manufacture relating to producing a low-skew routing for a network of a circuit design. One embodiment of the present invention can include a method of generating a low-skew routing for a network of a circuit design. The method can include routing connections between a source and a plurality of loads of the network and determining a delay for at least one routed connection. The routed connections can be accepted if the delay of each routed connection is within a skew tolerance range.

The skew tolerance range can be defined according to an amount by which propagation delays from the source to each of the plurality of loads of the network are permitted to vary and a target delay for the network. The target delay can be defined as a maximum of lowest delay paths between the source and each of the plurality of loads of the network.

If the delay for a routed connection of the network exceeds an upper bound of the skew tolerance range, the target delay can be increased such that it is equal to the delay for that routed connection. Accordingly, the method also can include deleting all routed connections for the network and routing connections between the source and the plurality of loads of the network using the increased target delay to specify the skew tolerance range. If the delay of at least one connection is less than a lower bound of the skew tolerance range, the method can include marking the routed network as non-skew optimized. In another embodiment, an indication can be provided that the circuit design is not feasible.

Routing connections can include selecting routing resources according to a base cost function that depends, at least in part, upon the target delay. The base cost function further can be defined such that it depends, at least in part, upon a measure of delay from the source to a routing resource being considered for a route for a connection of the network. In yet another embodiment, the base cost function can be defined such that it depends, at least in part, upon a measure of future cost for a routing resource being considered for a route for a connection of the network.

Another embodiment of the present invention can include a method of generating a low-skew routing for a network including identifying a target delay for the network and routing a connection from a source node to a selected target node of the network using a cost function that depends upon the target delay. The method further can include determining an actual delay for the routed connection and accepting the routed connection if the actual delay is within a skew tolerance range that depends upon the target delay.

The method can include defining the target delay as a maximum of lowest delay paths between the source node and each target node of the network. If the actual delay exceeds an upper bound of the skew tolerance range, the method can include setting the target delay equal to the actual delay, deleting all routed connections for the network, and routing connections of the network using the increased target delay in determining the skew tolerance range. If the actual delay is less than a lower bound of the skew tolerance range, the method can include indicating that the routed network is non-skew optimized or that the circuit design is not feasible.

Yet another embodiment of the present invention can include a machine readable storage, having stored thereon a computer program having a plurality of code sections for causing a machine to perform the various steps and/or implement the components and/or structures disclosed herein.

BRIEF DESCRIPTION OF THE DRAWINGS

There are shown in the drawings, embodiments which are presently preferred, it being understood; however, that the invention is not limited to the precise arrangements and instrumentalities shown.

The FIGURE is a flow chart illustrating a method of generating a low-skew network for a circuit design in accordance with one embodiment of the present invention.

DETAILED DESCRIPTION OF THE INVENTION

Figure 1:
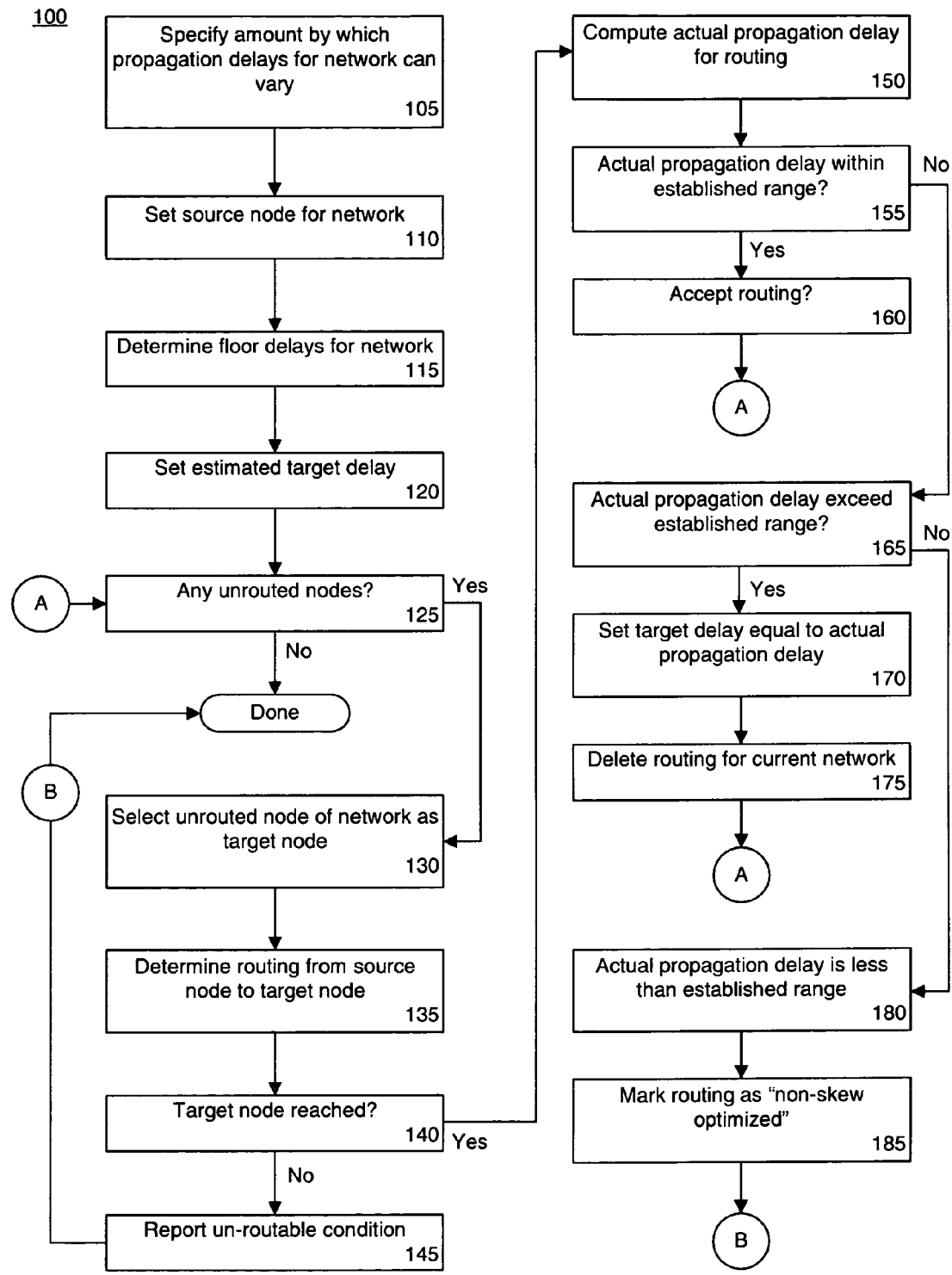

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein provide a solution for routing skew-sensitive networks. More particularly, the embodiments disclosed herein utilize a cost function that depends, at least in part, upon variations in propagation delays from source to loads. The network(s) can be routed such that the total delay to each load pin falls within a defined tolerance range, thereby ensuring that the resulting network conforms to established skew requirements. In consequence, general-purpose routing resources, as opposed to specialized, skew-sensitive routing resources, can be used for clock and/or data networks. This can reduce the cost and/or complexity of a field programmable gate array.

The FIGURE is a flow chart illustrating a method 100 of producing a low-skew network for a circuit design in accordance with one embodiment of the present invention. Method 100 can be used to produce a routing for a network having low skew, i.e. a skew within a defined range, as a requirement. From a higher perspective, the embodiments disclosed herein can be incorporated within, or used with, a congestion negotiation algorithm such as Pathfinder, as discussed in *Pathfinder: A Negotiation-Based Performance-Driven Router for FPGAs* by Larry McMurchie and Carl Ebeling, ACM Symposium on FPGAs (1995), A-star (A*) based maze-routing, rip-up and re-route-based routing techniques, or the like. This allows skew-sensitive networks to be routed using the embodiments disclosed herein, while other less-skew sensitive networks of a circuit design can be routed using other routing techniques.

Method 100 can begin in a state where a circuit design has been placed and a network N within the circuit design has been selected for low skew routing. Though network N can be a clock network, network N also can be another type of network, i.e. one comprised of data paths and one that requires low skew. Network N can include a driver, or source node, referred to as $N_D$, as well as one or more loads specified by the set $\{N_L\}$. Of the set of loads $N_L$, it also can be assumed that a set of loads $N_S$, or target loads, where $N_S \subseteq N_L$, are to be routed with low skew from the driver.

In step 105, the amount by which propagation delays for network N can vary can be set or established. To achieve a low-skew routing, each of the loads $N_S$ must be routed within an allowable tolerance with respect to propagation delay, i.e. skew. This tolerance, which is a design constraint specific to the function and/or application of the circuit design, can be defined as $\pm\delta$, where $\delta$ is a constant that specifies the value by which the propagation delays from the source to each individual load of the network are permitted to vary. The range of propagation delay for the low-skew network N can be defined, with respect to a reference point, such that $-\delta$ represents the lower bound of the range and $+\delta$ represents the upper bound of the range.

In step 110, node $N_D$ can be set as the source node. In one embodiment, the network can be a clock network. In that case, the source clock driver can be set as the source node. In another embodiment, for example where the network is a data network, the source node need not be a clock driver, but rather any node that marks the start of a signal path to one or more loads.

In step 115, the floor delays for network N can be determined. Floor delay refers to a best case routing delay, or a path having the lowest delay, between the source $N_D$ and some load l, where $l \in N_S$. The floor delay for a source $N_D$ and some load l can be denoted as $F_L$. In step 120, an estimated target delay, denoted as T, can be established. The estimated target delay T can be defined as the maximum of all of the floor delays among all of the nodes in $N_S$, or $T = \max(F_L)$.

In step 125, a determination can be made as to whether there are any un-routed nodes $N_S$ of network N, or of the source node $N_D$. If not, the method can end as each node of network N has been routed. If one or more nodes $N_S$ remain, however, the method can continue to step 130 where an un-routed node, denoted as q, is selected from the set of nodes $N_S$ as a target node.

In step 135, a routing for a connection between the source node $N_D$ and the selected load q can be determined. A connection can refer to a portion of a network, between a source node and a load node of the network. In one embodiment, an A* search can be performed from the source $N_D$ to the target node q to determine the routing for the connection. As known, A* search is a directed, breadth-first search algorithm that reduces the worst-case runtime complexity of searching in graphs as compared to a simple, breadth-first search. The circuit design can be represented as a graph G(V,E), where V represents a set of vertices corresponding to routing resources in an FPGA and E represents the set of edges corresponding to the switches that connect the routing resources in the FPGA. Each edge $e_{ij}$, where $e_{ij} \in E$ connects the vertices $v_i$, where $v_j \in V$. The edges can be directional. As such, an edge $e_{ij}$ can be directed from $v_i$ to $V_j$, with the resulting path being denoted as a set of connected vertices $\{v_s, v_1, v_2 \ldots v_{n-1}, v_n, \ldots v_t\}$. For two adjacent vertices $v_{n-1}$ and $v_n$ in the path, there should be an edge $e_{n-1,n} \in E$. A real, non-negative cost may be associated with each of the vertices.

The routing can be performed according to a cost function. In one embodiment, a base cost $B_i$ for utilizing a given routing resource $R_i$ can be defined as $B_i = |\alpha G_i + \beta H_i - \gamma T|$. The term $G_i$ can represent the delay from the source node $N_D$ to the resource $R_i$. The term $H_i$, which is a function of delay, can represent a future-cost from the resource $R_i$ to the target node, i.e. node q. In illustration, the future cost $H_i$ for a vertex can be representative of the cost based on the delay of the remaining path from the current vertex $v_i$ to a target vertex $v_t$. The future-cost for every vertex typically is estimated based upon the structure of the routing graph. The target delay T, as discussed, represents the estimated target delay which is defined as $T = \max(F_L)$. The terms $\alpha$, $\beta$, and $\gamma$ represent constants that can be used as tuning parameters for the based cost $B_i$. In any case, the cost of a particular path can be defined as the sum, or other function, of the base costs for each routing resource used in the path from the source node $N_D$ to the selected load q.

In step 140, a determination can be made as to whether the target node q was reached. If not, the method can proceed to step 145 where an un-routable condition can be reported and the method can end. If the target node q is reached, the method can proceed to step 150. In step 150, an actual propagation delay, denoted as $T_q$, can be calculated for the path determined in step 135 from the source $N_D$ to the target node q. In step 155, a determination can be made as to whether the actual propagation delay $T_q$ is within the established skew tolerance range. More particularly, if $T - \delta \leq T_q \leq T + \delta$, the target node q, i.e. the load, was successfully routed. In that case, the route, referring to the path and/or sequence of connected routing resources on the FPGA device, can be accepted in step 160 and the method can proceed to step 125 to continue routing further un-routed loads of network N. If $T_q$ is not within the specified range, the method can proceed to step 165.

In step 165, a determination can be made as to whether $T_q > T + \delta$. If not, the method can proceed to step 180. If $T_q$ does exceed $T + \delta$, the method can proceed to step 170 where the target delay T is adjusted according to the actual delay achieved in step 150. More particularly, T can be set equal to $T_q$. This condition can occur in situations in which the routing area between the driver and the target node q has significant routing congestion due to the routes of other networks. In any case, when the actual propagation delay for the path determined from the source $N_D$ to the target node q exceeds the upper bound of the established range, the method can proceed to step 175 where all routing for network N can be deleted. The method then can return to step 125 to begin routing the network N again using the adjusted target delay T to define the skew tolerance range.

Continuing with step 180, in the case where $T_q$ does not exceed T+δ, it can be determined that the actual propagation delay is less than the lower bound of the established skew tolerance range. That is, it can be determined that $T_q$<T−δ. In that case, the method can proceed to step 185, where the routing from the source $N_D$ to the target node q, as well as the network as a whole, can be marked or annotated as "non-skew optimized". This condition can occur in situations in which no routing paths exist between the source $N_D$ and the target node q that are slow enough to satisfy the skew requirements. This situation cannot be resolved as it is either a limitation of the circuit design itself and/or a limitation of the device. In either case, the routing can be retained but marked as indicated.

In another embodiment, the condition described with reference to step 185 can be handled in a different fashion. In an alternative embodiment, for example, the design can be reported as "infeasible". In that case, the method can simply proceed to jump circle B and end. This allows the circuit designer to make the necessary changes to the circuit design before further attempts are made to route the network N.

The embodiments disclosed herein present a solution for routing a low-skew network. As such, the need for using specialized, low-skew routing resources is reduced, if not eliminated, thereby reducing FPGA system costs. While the embodiments described herein can be used independently to route a low-skew network, such embodiments also can be used with overlap-removal based routing algorithms to produce a smooth tradeoff between routability, delay, and skew within a single process.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising in that such terms are intended to be "open" language.

This invention can be embodied in other forms without departing from the spirit or essential attributes thereof. Accordingly, reference should be made to the following claims, rather than to the foregoing specification, as indicating the scope of the invention.

What is claimed is:

1. A method of generating a low-skew routing for a network of a circuit design comprising:
   routing connections between a source and a plurality of loads of the network;
   determining a delay for at least one routed connection; and
   accepting the routed connections if the delay of each routed connection is within a skew tolerance range;
   wherein routing connections further comprises selecting routing resources according to a base cost calculated for each routing resource selected for routing the connections between the source and the plurality of loads of the network, wherein the base cost for each routing resource comprises a delay from the source to the routing resource multiplied by a first tuning factor and an estimated delay from the routing resource to one of the plurality of loads multiplied by a second tuning factor, and a target delay specified as a maximum of lowest delay paths between the source and each of the plurality of loads of the network.

2. The method of claim 1, further comprising defining the skew tolerance range according to an amount by which propagation delays from the source to each of the plurality of loads of the network are permitted to vary and a target delay for the network.

3. The method of claim 2, further comprising if the delay for a routed connection of the network exceeds an upper bound of the skew tolerance range, increasing the target delay to be equal to the delay for that routed connection.

4. The method of claim 3, further comprising:
   deleting all routed connections for the network; and
   routing connections between the source and the plurality of loads of the network using the increased target delay to specify the skew tolerance range.

5. The method of claim 1, further comprising marking the routed network as non-skew optimized if the delay of at least one routed connection is less than a lower bound of the skew tolerance range and indicating that each routing path that exists for the at least one routed connection has a delay that is too small for the at least one routed connection to have a skew within the skew tolerance range.

6. The method of claim 1, further comprising indicating that the circuit design is not feasible if the delay of at least one routed connection is less than a lower bound of the skew tolerance range.

7. A machine readable storage, having stored thereon a computer program having a plurality of code sections, which when executed by a computer perform the following steps, the code comprising:
   code for routing connections between a source and a plurality of loads of a network of a circuit design;

code for determining a delay for at least one routed connection; and code for accepting the routed connections if the delay of each routed connection is within a skew tolerance range;

wherein the code for routing connections further comprises code for selecting routing resources according to a base cost calculated for each routing resource selected for routing the connections between the source and the plurality of loads of the network, wherein the base cost for each routing resource comprises a delay from the source to the routing resource multiplied by a first tuning factor and an estimated delay from the routing resource to one of the plurality of loads multiplied by a second tuning factor, and a target delay specified as a maximum of lowest delay paths between the source and each of the plurality of loads of the network.

8. The machine readable storage of claim 7, further comprising code for defining the skew tolerance range according to an amount by which propagation delays from the source to each of the plurality of loads of the network are permitted to vary and a target delay for the network.

9. The machine readable storage of claim 8, wherein the delay for at least one routed connection exceeds an upper bound of the skew tolerance range, the machine readable storage further comprising:

code for increasing the target delay to be equal to the delay;

code for deleting all routed connections for the network; and code for routing connections of the network using the increased target delay to specify the skew tolerance range.

10. The machine readable storage of claim 7, wherein the delay of at least one routed connection is less than a lower bound of the skew tolerance range, the machine readable storage further comprising code for marking the routed network as non-skew optimized and for indicating that each routing path that exists for the at least one routed connection has a delay that is too small for the at least one routed connection to have a skew within the skew tolerance range.

* * * * *